US005937412A

United States Patent [19]
Kohli et al.

[11] Patent Number: 5,937,412
[45] Date of Patent: Aug. 10, 1999

[54] METHOD AND SYSTEM FOR PACKAGING SERVICE LOGIC PROGRAMS IN AN ADVANCED INTELLIGENT NETWORK

[75] Inventors: Pardeep Kohli; Sahana Rao, both of Plano, Tex.

[73] Assignee: Alcatel USA Sourcing, L.P., Plano, Tex.

[21] Appl. No.: 08/999,007

[22] Filed: Dec. 29, 1997

[51] Int. Cl.[6] .................................................. G06F 9/00
[52] U.S. Cl. ........................ 707/104; 379/112; 379/113
[58] Field of Search .......................................... 707/1–204

[56] References Cited

U.S. PATENT DOCUMENTS 5,774,530  6/1998  Montgomery et al. ................. 379/112
5,802,145  9/1998  Farris et al. ............................. 379/34
5,854,835  12/1998  Montgomery et al. ................ 379/113

*Primary Examiner*—Paul V. Kulik
*Assistant Examiner*—John G. Mills, III
*Attorney, Agent, or Firm*—Baker & Botts, L.L.P.

[57] ABSTRACT

A method of packaging service logic programs for dissemination in a telecommunications network includes receiving a request to package a service logic program having a plurality of service independent blocks associated with a plurality of parameters. The service logic program is copied and parsed to automatically identify the parameters associated with the service logic program. The service independent blocks of the service logic program are stored in a packaging file in a specified sequence. The associated parameters are copied and then stored in the packaging file.

17 Claims, 4 Drawing Sheets

METHOD AND SYSTEM FOR PACKAGING SERVICE LOGIC PROGRAMS IN AN ADVANCED INTELLIGENT NETWORK

TECHNICAL FIELD OF THE INVENTION

This invention relates generally to the field of telecommunications, and more particularly to a method and system for packaging service logic programs in an advanced intelligent network (AIN).

BACKGROUND OF THE INVENTION

With the advent of the advanced intelligent network (AIN), it has become possible to rapidly design and introduce many new enhanced telecommunications services that provide subscribers with added flexibility and convenience in the use of telephone equipment. In the advanced intelligent network, service logic programs (SLP) and database schema implementing these new services are typically designed at the service creation environment (SCE). The service creation environment is coupled to a service management system (SMS) which supports the operations, administrations, management, and provisioning (OAM&P) needs of the network.

The service management system also functions as an interface between the service creation environment and the rest of the network nodes by disseminating the service logic programs and database schema to network nodes for execution. The advanced intelligent network nodes typically include switches or service switching points (SSPs) coupled to signal transfer points (STPs), which are in turn coupled to service control points (SCPs). The service control points execute service logic programs which define the services and further store and maintain databases that have data associated with the services.

The service logic programs are generally constructed of an arrangement of service independent blocks(SIB). The service independent blocks include a number of parameters, such as, for example, global variables, counters, procedures, and templates that may vary depending on the service and the operating environment in which the service is deployed. These parameters are packaged as part of the service logic programs in the service creation environment. Typically, the parameters are packaged by a programmer manually reviewing the service independent blocks of a service logic program to identify the appropriate parameters and then copying the parameters to the service logic program. In addition to the service logic program, the packaging program manually combines stored procedures and data templates to consolidate services package. This is time consuming, expensive and prone to mistakes.

SUMMARY OF THE INVENTION

In accordance with the present invention, a method and system for packaging service logic programs is provided that substantially reduces or eliminates disadvantages and problems associated with prior systems and methods. In particular, the method and system automatically packages service logic programs to reduce the time and expense associated with providing telephony services in an advanced intelligent network.

In one embodiment, the method of packaging service logic programs for dissemination in a telecommunications network includes receiving a request to package a service logic program having a plurality of service independent blocks associated with a plurality of parameters. The service logic program is copied and parsed to automatically identify the parameters associated with the service logic program. The service independent blocks of the service logic program are stored in a packaging file in a specified sequence. The associated parameters are copied and then stored in the packaging file.

Technical advantages of the present invention include providing an improved method and system of packaging service logic programs for dissemination in a telecommunications network. In particular, the method and system automatically identifies, copies and stores parameters associated with the service logic program as part of the packaged service logic program. The parameters may be stored procedures, data templates, global variables, peg counters and prompts. Accordingly, the packaging process does not require that a computer operator, such as a programmer, manually identify the parameters associated with the service logic program. In addition, an operator does not need to manually add stored procedures, data templates and data schema. This reduces the time and expense associated with providing telephony services in an advanced intelligent network. In addition, human error is avoided.

Other technical advantages will be readily apparent to one skilled in the art from the following figures, description, and claims.

BRIEF DESCRIPTION OF THE DRAWINGS

For a more complete understanding of the present invention, and its advantages thereof, reference is now made to the following description taken in conjunction with the accompanying drawings in which.

DETAILED DESCRIPTION OF THE INVENTION

Figure 1:
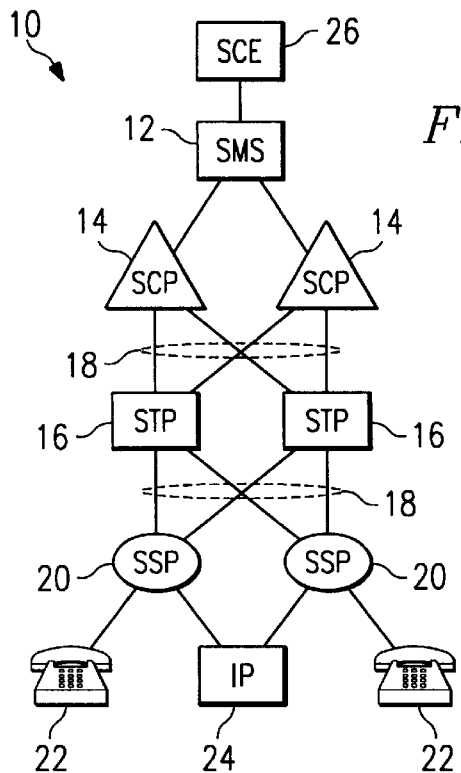
FIG. 1 is a block diagram illustrating an exemplary telecommunications network such as an advanced intelligent network (AIN) for use in connection with the present invention.

FIG. 1 is a block diagram illustrating an advanced intelligent network (AIN) 10 for use in connection with the present invention. The advanced intelligent network 10 includes a service management system (SMS) 12 that interfaces with a plurality of service control points (SCP) 14 and a plurality of signal transfer points (STP) 16 via an industry standard protocol, such as X.25. The service management system 12 provides network information, database management, and administrative support for the advanced intelligent network 10. The service management system 12 generally interfaces with service control points 14 for provisioning, database management, service control point application program management, and collecting traffic metering measurement data.

The service control points 14 may be directly linked to the signal transfer points 16 via a signaling system number 7

(SS7) link set 18. The signal transfer points 16 are further coupled through signaling system number 7 link set 18 to one or more service switching points (SSP) 20, which perform switching and call handling functions in the network 10. The service control points 14 are transaction-based processing systems whose primary responsibility is to respond to queries from service switching points 20 for data needed to complete routing of a call. The service switching points 20 are part of a publicly switched telephone network (PSTN) and are coupled to the telephone service subscribers, which include wire-based telephones, wireless telephones 22 and intelligent peripherals 24.

A service creation environment (SCE) 26 allows the creation and testing of service logic programs (SLP) outside of the network 10. The service logic programs define network services by specifying triggering events encountered in the service switching points 20 that require database access and logic for additional processing of telephone calls. As described in more detail below, the service logic programs are packaged in the service creation environment 26 and the packages downloaded to the service control points 14 and the signal transfer points 16 through the service management system 12 for execution on the network 10.

Figure 2:
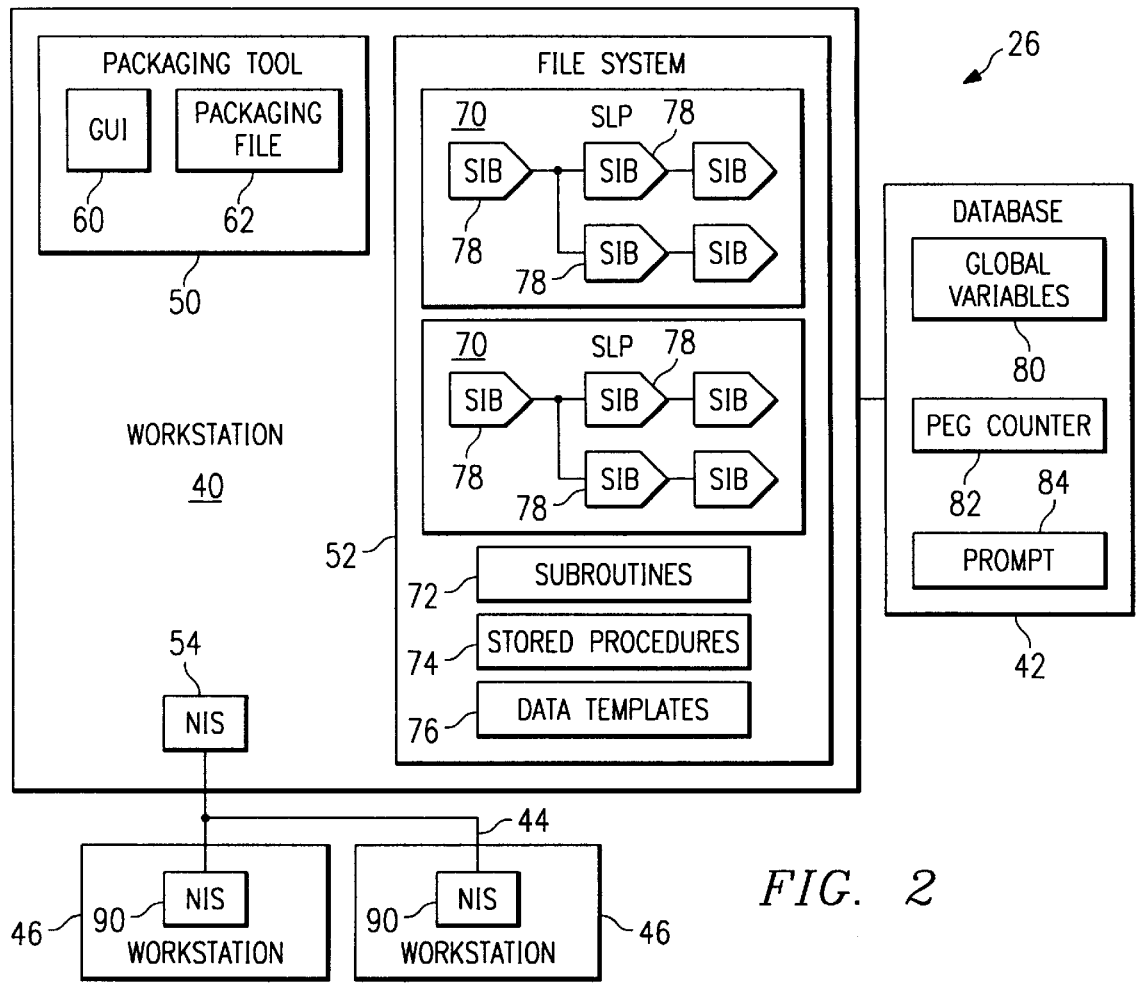
FIG. 2 is a block diagram illustrating details of a service creation environment (SCE) in accordance with the present invention.

FIG. 2 is a block diagram illustrating details of the service creation environment 26 in accordance with the present invention. The service creation environment 26 provides an abstract, high-level program environment for creating telecom services. The service creation environment 26 includes a workstation 40 and database 42 connected via a network 44 to a plurality of workstations 46.

The workstation 40 can be any type of computer capable of storing and processing data. The workstation 40 includes computer software that is loaded into memory and executed by a processor. The computer software is generally identified by discrete modules such as tools, files and systems. It will be understood that the computer software may be otherwise combined or divided for processing without departing from the scope of the present invention. Accordingly, labels of the modules are for illustrative purposes and may be varied.

The workstation 40 includes a packaging tool 50, file system 52 and network interface system (NIS) 54. The packaging tool 50 packages service logic programs stored in the file system 52. A service logic program is packaged by bundling it with database schema and other parameters used to implement the service logic program in a telecommunications network environment. The parameters optimize functionality of the service logic program in a particular environment. The parameters are any suitable data, instructions or programmatic elements that vary for the service logic programs. The parameters may include stored procedures, data templates, global variables, peg counters and prompts or any other suitable parameter.

The packaging tool 50 is programmed in the TCL/TK and Incr Tcl programming language and has a graphical user interface 60 and generates a packaging file 62. The interface 60 is a graphical user interface (GUI) operable to graphically interact with an operator using a workstation 46 to request, receive and display information on the workstation 46. It will be understood that other types of suitable interfaces, including non-graphical interfaces may be used in connection with the packaging tool 50. It will be further understood that the packaging tool 50 may be programmed in other suitable high order programming languages.

The packaging file 62 is created by the packaging tool 50 during the packaging process to bundle the service logic program with its subroutines and parameters. The service logic programs, subroutines and parameters are stored in the packaging file 62 in a CORBA (Common Object Request Broker Architecture) format that can be readily used in the network 10. At the end of the packaging process, the packaging tool 50 saves the packaging file 62 under a name and at a location specified by the operator.

The file system 52 stores service logic programs 70, subroutines 72, stored procedures 74 and data templates 76 as text files. Each service logic program 70 is a set of instructions on how a call will proceed. The service logic program 70 includes a plurality of service information blocks (SIB) 78 arranged in a specific order to provide call processing for a telephony service. The service independent blocks 78 are basic telecom service building blocks that have been developed to construct service logic programs 70 to implement network services. The service independent blocks 78 may be any suitable generic functional blocks that can be reused to form network services. The service independent building blocks, as defined by the International Telecommunications Union CCITT ITU-T Q.1213, are used in the service creation environment to produce service logic programs that are then downloaded to the service management system 12, service control point 14 and signal transfer points 16, where they are executed.

The subroutines 72 are each a complex set of instructions constructed of a bundle of lower level service independent blocks 78. The subroutines 72 allow a complex set of instructions to be defined once and reused within one or more service logic programs 70. It will be understood that the service logic program 70 may be configured without subroutine 72.

The stored procedures 74 are database subroutines called by the service logic program 70 during operation to access and retrieve data from a network database. The data templates 76 define the format of database tables used by the service logic programs 70. The tables may be look up tables or any other type of suitable table used by a telephony service. The format of the stored procedures 74 and data templates 76 should therefore be compatible with the network database, typically SyBase.

The database 42 is a SyBase database and includes global variables 80, peg counters 82 and user prompts 84. The global variables 80 store finite values and other information used by the service logic programs 70. The peg counters 82 are counters used by the service logic programs 70 to time functions and operations of the service. The prompts 84 are announcements, tones or any other type of indication that data or information is needed by the network service.

The network interface system 54 communicates with the network 44 to transmit and receive information from the workstations 46. The network 44 may be a local area network (LAN), a wide area network (WAN) or any other type of network capable of supporting data transfer. The network 44 may include a combination of an integrated services digital network (ISDN) communication line, a hardware line, a telephone line or any other suitable link. It will be understood that the workstation 40 may be a non-networked, stand-alone system. In this embodiment, files may be transferred by disk, tape or other storage medium.

The workstations 46 allow an operator to access the workstation 40 and utilize the packaging tool 50 to package the service logic programs 70 for dissemination in the network 10. The workstation 46 is a UNIX workstation or any other platform capable of accessing and utilizing the packaging tool 50. The workstation 46 includes a network interface system (NIS) 90 that communicates with the network 44 to transmit information and receive information from the workstation 40.

Figure 3:
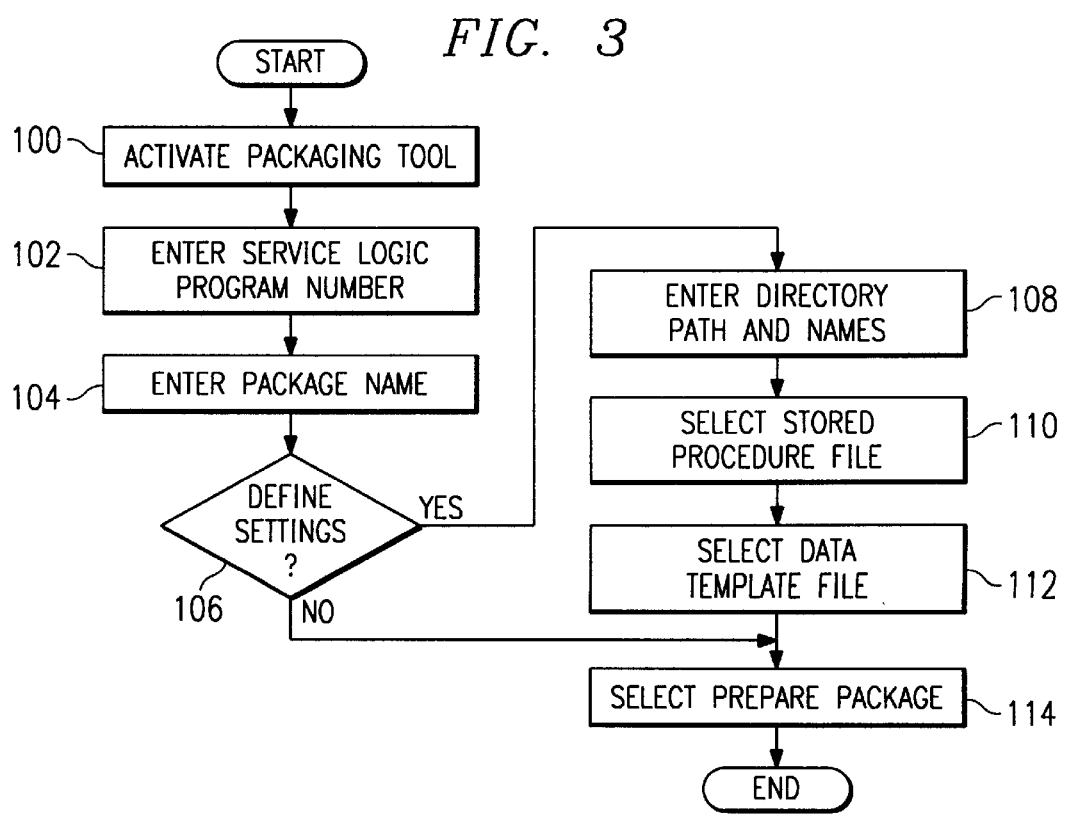
FIG. 3 is a flow diagram illustrating an operator process for packaging service logic programs in accordance with the present invention.
Figure 4A:
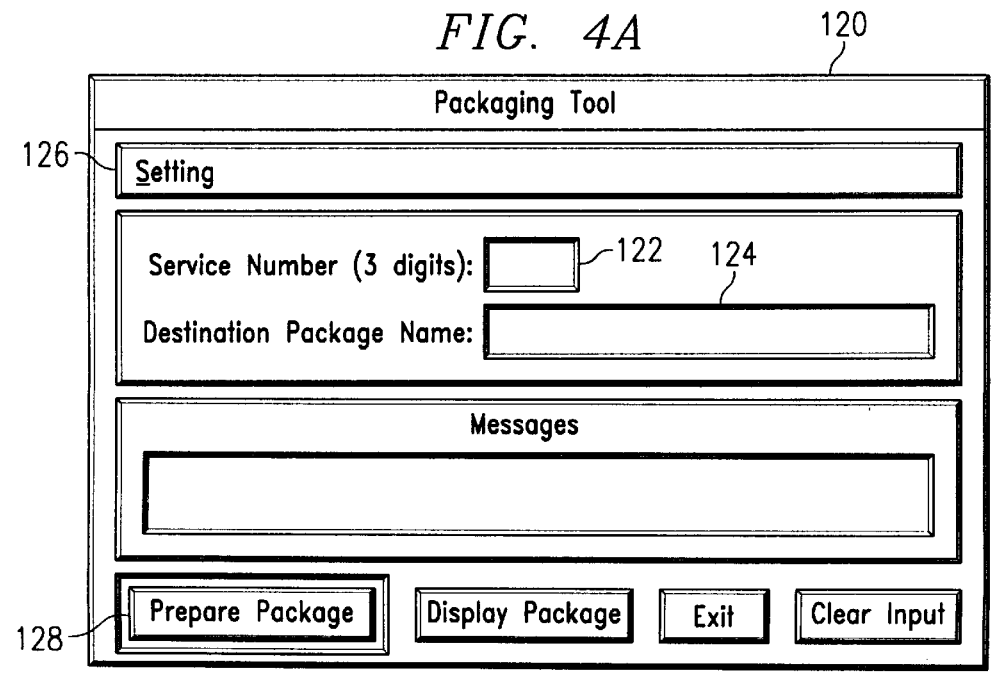
FIGS. 4A–B are exemplary computer displays for packaging service logic programs in accordance with the present invention.
Figure 4B:
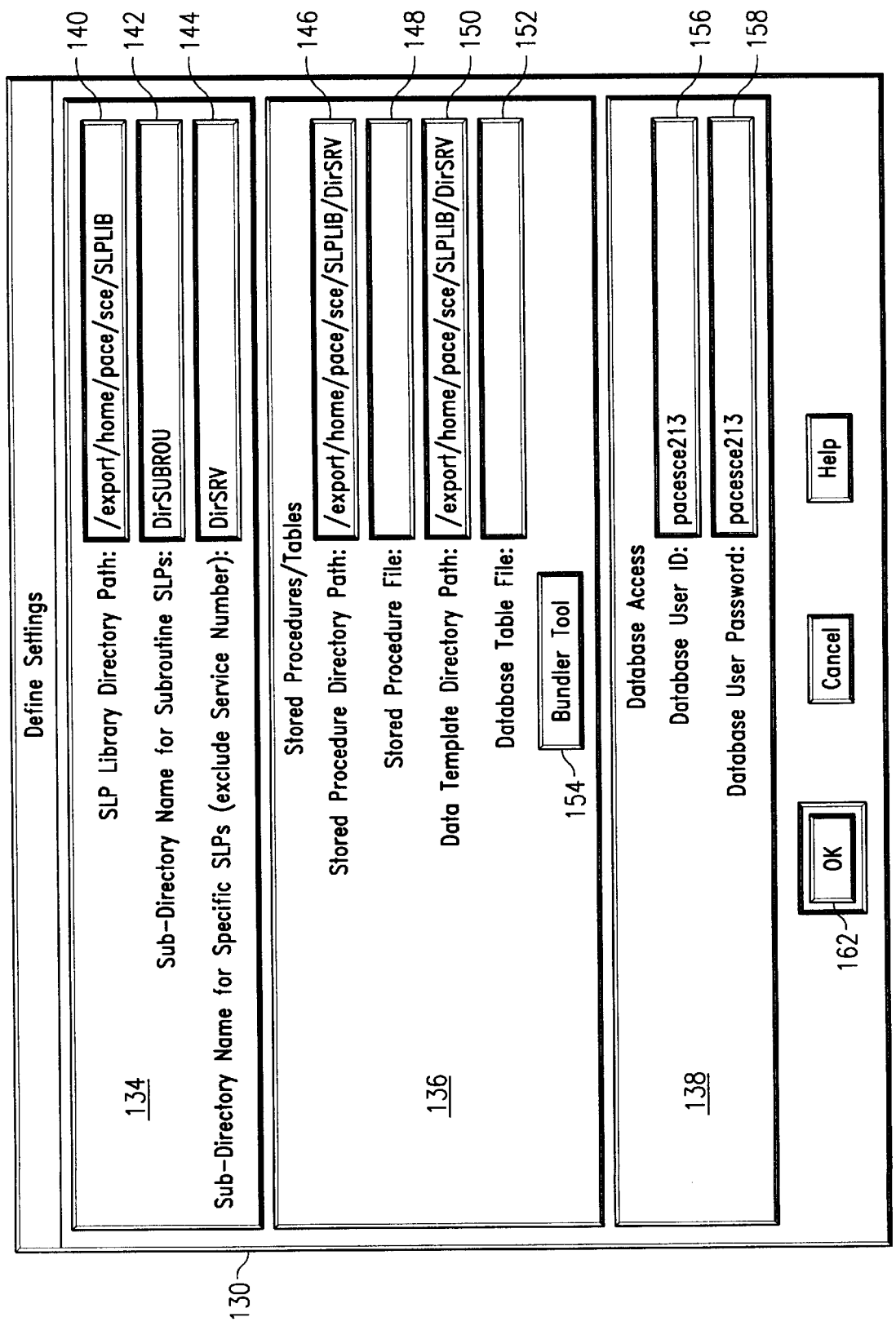

FIG. 3 is a flow diagram illustrating an operator process for packaging service logic programs 70 in accordance with the present invention. FIGS. 4A–B are exemplary computer displays provided by the interface 60 of the packaging tool 50 for the operator process of FIG. 3.

Referring to FIG. 3, the operator process begins at step 100 in which the operator activates the packaging tool 50. In response to activation of the packaging tool 50, the interface 60 displays a main packaging screen 120 as shown by FIG. 4A. Referring to FIG. 4A, the main packaging screen 120 includes a service number field 122, a destination package name field 124, a settings option 126 and a prepare package button 128.

Returning to FIG. 3, the operator at step 102 enters a number identifying a service logic program to be packaged into the service number field 122 of the main packaging screen 120. The service logic programs are conventionally identified with a three-digit number. It will be understood that a service logic program 70 may be otherwise identified for packaging without departing from the scope of the present invention.

Proceeding to step 104, the operator enters a package name into the destination package name field 124 of the main packaging screen 120. Next, at decisional step 106, the operator may decide if settings need to be changed for the packaging process. Initially, default settings may be defined for the settings. To change the default settings, the operator selects the settings option 126 of the main packaging screen 120. In response to selection of the settings option 126, the interface 60 displays a settings screen 130 as shown by FIG. 4B.

Referring to FIG. 4B, the settings screen 130 includes a service logic program section 132, a stored procedures/table section 136 and a database access section 138. The service logic program section 134 includes an SLP library directory path field 140, a sub-directory name for subroutine SLPs field 142 and a sub-directory name for specific SLPs field 144. The fields 140–144 identify the location of the service logic programs 70 and the subroutines 72. The fields contain default values unless altered by the operator.

The stored procedures/table section 136 includes a stored procedure directory path field 146, a stored procedure file extension field 148, a data template directory path field 150 and a database table file extension field 152. The data fields 146–152 identify the location/file extensions of the stored procedures 74 and the data templates 76. The directory path fields contain default values unless altered by the operator.

The stored procedures/table section 136 also includes a bundler tool button 154 to select the stored procedures/data template files to be included with a service logic program 70. In response to selection of the bundler tool button 154, the interface 60 displays a list of stored procedure files that reside in the directory path defined by the stored procedure directory path field 146 and a list of data template files that reside in the directory path defined by the data template directory path field 150. The user can then select the required stored procedures/data template files.

The database access section 138 includes a user ID field 156 and a user password field 158 that the package tool will use to access the database. After the operator has completed defining the settings for a packaging operation, the operator may click the OK button 160 and return to the main packaging screen 120.

Returning to FIG. 3, if the operator elects to define the settings, the YES branch of decisional step 106 leads to step 108. At step 108, the operator enters service logic program information into fields 140–144 of the settings screen 130. At step 110, the operator enters stored procedure information and selects stored procedure files directory/extensions for fields 146–148 of the settings screen 130. At step 112, the operator enters data template information and selects a data template file directory/extensions for fields 150–152 of the settings screen 130. After the operator has finished defining the settings for the packaging process, the operator selects the "OK" button 162 of the settings screen 130 to return to the main packaging screen 120.

Step 112 leads to step 114. Returning to decisional step 106, if settings are not to be defined, the NO branch also leads to step 116. At step 116, the operator selects the prepare package button 128 of the main packaging screen 120 to complete the operator process.

Figure 5:
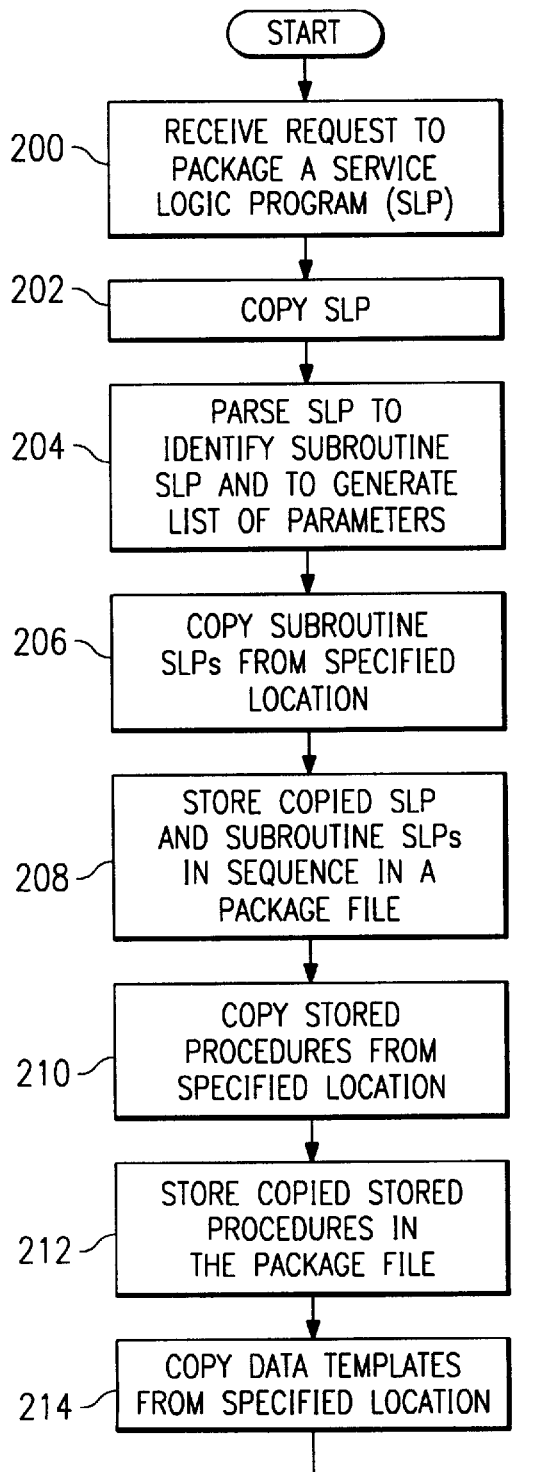
FIG. 5 is a flow diagram illustrating a computer method of packaging service logic programs in accordance with the present invention.
Figure 5:
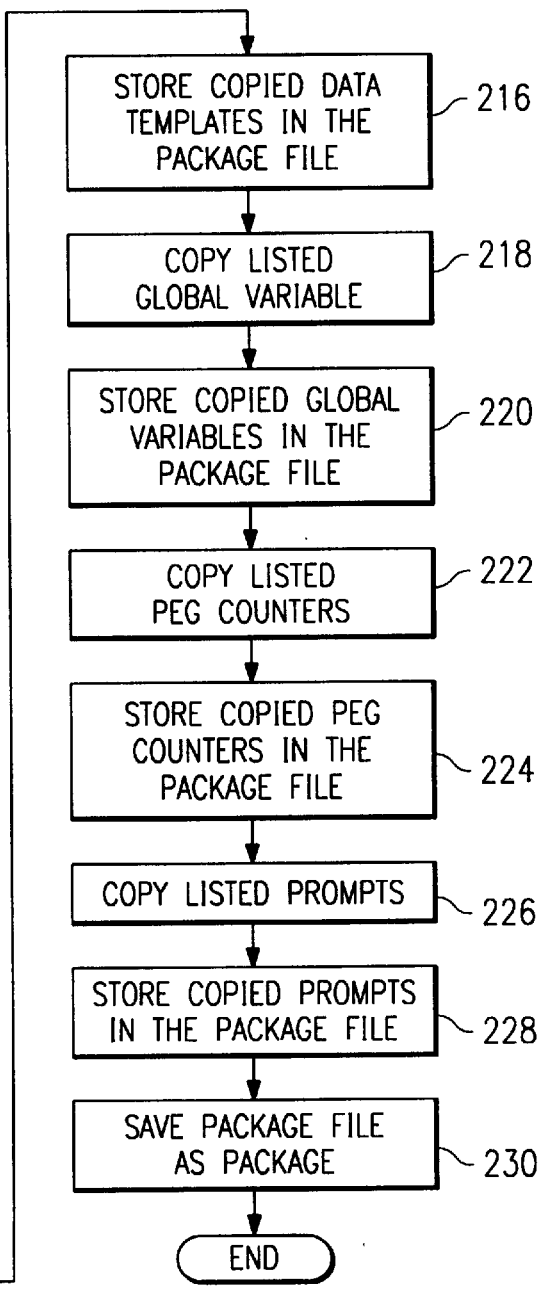

FIG. 5 is a flow diagram illustrating a computer method of packaging service logic programs 70 in accordance with the present invention. The computer process begins at step 200 in which the packaging tool 50 receives a request to package a service logic program 70. At step 202, the packaging tool 50 copies the selected service logic program 70 from the location specified by fields 140–142 of the settings screen 130.

Proceeding to step 204, the packaging tool 50 parses the service logic program 70 to identify subroutines and to generate a list of parameters associated with the service logic program 70. The associated subroutines and parameters may be embedded or otherwise called or specified by the service independent blocks 78. At step 206, the packaging tool copies the subroutines 72 from the location specified by fields 140 and 144 of the settings screen 130.

Next, at step 208, the copied service logic program 70 and subroutines 72 are stored in the packaging file 62 in a specified sequence. The sequence is specified by the arrangement and logic of the service independent blocks 78 of the service logic program 70. It will be understood that the service logic program may be stored in the packaging file 62 by a service creation environment tool other than the packaging tool 50.

Proceeding to step 210, the packaging tool 50 copies stored procedures 74 associated with the service logic program 70 from the location specified by fields 146 and 148 of the settings screen 130. At step 212, the copied stored procedures 74 are stored in the packaging file 62 after the service independent blocks 78 of the service logic program 70 and subroutines 72.

Next, at step 214, the packaging tool 50 copies data templates 76 associated with the service logic program 70 from the location specified by fields 150 and 152 of the settings screen 130. At step 216, the copied data templates 76 are stored in the packaging file 62 after the stored procedures 74.

Proceeding to step 218, the packaging tool 50 copies global variables 80 associated with the service logic program 70 from the database 42. At step 220, the copied global variables 80 are stored in the packaging file 62 after the data templates 76.

Next, at step 222, the packaging tool 50 copies peg counters 82 associated with the service logic program 70 from the database 42. At step 224, the copied peg counters 82 are stored in the packaging file 62 after the global variables 80.

Proceeding to step 226, the packaging tool 50 copies prompts 84 associated with the service logic program 70 from the database 42. At step 228, the copied prompts 84 are stored in the packaging file 62 after the peg counters 82. So configured, the packaging file 62 bundles the stored service independent blocks 78 of the service logic program 70 and subroutines 72 with stored procedure, data template, global variable, peg counter and prompt parameters. At step 230, the packaging tool 50 saves the packaging file 62 with the name specified by field 124 of the main packaging screen 120 to complete the packaging process.

Although the present invention has been described with several embodiments, various changes and modifications may be suggested to one skilled in the art. It is intended that the present invention encompass such changes and modifications as fall within the scope of the appended claims.

What is claimed is:

1. A method of packaging a service logic program for dissemination in a telecommunications network, comprising the steps of:

receiving a request to package a service logic program having a plurality of service independent blocks associated with a plurality of parameters;

copying the service logic program;

automatically identifying the parameters associated with the service logic program by parsing the service logic program;

automatically storing the service independent blocks of the service logic program in a packaging file in a specified sequence;

automatically copying the associated parameters; and automatically storing the associated parameters in the packaging file.

2. The method of claim 1, wherein service independent blocks are associated with a plurality of subroutines, further comprising the steps of:

automatically identifying the subroutines associated with the service logic program by parsing the service logic program;

automatically copying the associated subroutines; and automatically storing the associated subroutines in the packaging file with the service independent blocks in the specified sequence.

3. The method of claim 1, wherein the associated parameters are from a group of parameters comprising stored procedures, data templates, global variables, peg counters and prompts.

4. The method of claim 3, if the associated parameters include a stored procedure, further comprising the steps of:

automatically copying the stored procedure from a predefined stored procedure file; and automatically storing the stored procedure in the packaging file.

5. The method of claim 3, if the associated parameters include a data template, further comprising the steps of:

automatically copying the data template from a predefined data template file; and automatically storing the data template in the packaging file.

6. The method of claim 3, if the associated parameters include a global variable, further comprising the steps of:

automatically copying the global variable from a database; and automatically storing the global variable in the packaging file.

7. The method of claim 3, if the associated parameters include a peg counter, further comprising the steps of:

automatically copying the peg counter from a database; and automatically storing the peg counter in the packaging file.

8. The method of claim 3, if the associated parameters include a prompt, further comprising the steps of:

automatically copying the prompt from a database; and automatically storing the prompt in the packaging file.

9. The method of claim 1, wherein the associated parameters are from a group of parameters comprising stored procedures, data templates, global variables, peg counters and prompts, further comprising the steps of:

if the associated parameters include a stored procedure:
      automatically copying the stored procedure from a predefined stored procedure file;
      automatically storing the stored procedure in the packaging file;

if the associated parameters include a data template:
      automatically copying the data template from a predefined data template file;
      automatically storing the data template in the packaging file;

if the associated parameters include a global variable:
      automatically copying the global variable from a database;
      automatically storing the global variable in the packaging file;

if the associated parameters include a peg counter:
      automatically copying the peg counter from the database;
      automatically storing the peg counter in the packaging file;

if the associated parameters include a prompt:
      automatically copying the prompt from the database; and
      automatically storing the prompt in the packaging file.

10. The method of claim 1, further comprising the steps of:

storing a location of the service logic programs; and copying the service logic programs from the location.

11. The method of claim 10, wherein the location is a name and path of a service logic program directory.

12. The method of claim 2, further comprising the steps of:

storing a location of the subroutines;

copying the subroutines from the location.

13. The method of claim 12, wherein the location is a name and path of a subroutine directory.

14. The method of claim 1, further comprising the steps of:

storing a location of the stored procedure; and copying the stored procedure from the location.

15. The method of claim 14, wherein the location is a name and path of a stored procedure file.

16. The method of claim 1, further comprising the steps of:

storing a location of the data template; and copying the data template from the location.

17. The method of claim 16, wherein the location is a name and path of a data template file.

* * * * *